United States Patent
Hinz

(10) Patent No.: US 8,410,963 B2
(45) Date of Patent: Apr. 2, 2013

(54) DATA CONVERTER CIRCUIT AND METHOD

(75) Inventor: Torsten Hinz, Augsburg (DE)

(73) Assignee: Infineon Technologies AG, Neubiberg (DE)

( * ) Notice: Subject to any disclaimer, the term of this patent is extended or adjusted under 35 U.S.C. 154(b) by 84 days.

(21) Appl. No.: 13/070,293

(22) Filed: Mar. 23, 2011

(65) Prior Publication Data

US 2012/0242522 A1    Sep. 27, 2012

(51) Int. Cl.
*H03M 3/00* (2006.01)

(52) U.S. Cl. ........ 341/143; 369/143; 369/170; 381/103; 381/107; 375/148; 375/285; 375/322; 375/346; 375/376; 455/118; 455/258; 455/296; 455/306; 331/11; 331/16

(58) Field of Classification Search .......... 341/143–170; 369/44.34, 44.41; 381/103, 107; 375/148, 375/285, 322, 346, 376; 455/118, 258, 296, 455/306; 331/11, 16
See application file for complete search history.

(56) References Cited

U.S. PATENT DOCUMENTS

| | | | | | |
|---|---|---|---|---|---|
| 3,869,674 | A | * | 3/1975 | Borbely | 381/3 |
| 5,299,073 | A | * | 3/1994 | Dorricott et al. | 360/73.12 |
| 5,479,556 | A | * | 12/1995 | Oh | 388/805 |
| 6,353,647 | B1 | * | 3/2002 | Wilhelmsson et al. | 375/376 |
| 6,518,899 | B2 | * | 2/2003 | Yu | 341/118 |
| 6,597,371 | B2 | * | 7/2003 | Mandl | 345/691 |
| 6,930,626 | B2 | * | 8/2005 | Brooks et al. | 341/143 |
| 7,170,360 | B2 | | 1/2007 | Braun | |
| 8,047,724 | B2 | * | 11/2011 | Kamikawa et al. | 384/589 |

* cited by examiner

*Primary Examiner* — Lam T Mai
(74) *Attorney, Agent, or Firm* — Slater & Matsil, L.L.P.

(57) ABSTRACT

In an embodiment, an oversampled data converter includes a lowpass filter having a filter stage comprising a dynamic limiter, where the dynamic limiter having a limit set by an signal level at an input to the oversampled data converter. The oversampled data converter also includes a quantizing block comprising an input coupled to an output of the lowpass filter and an output coupled to an input of the lowpass filter.

24 Claims, 4 Drawing Sheets

DATA CONVERTER CIRCUIT AND METHOD

TECHNICAL FIELD

This invention relates generally to semiconductor circuits and methods, and more particularly to a data converter circuit and method.

BACKGROUND

Class-D amplifiers are used in audio amplification circuits for a wide variety of products such as MP3 players, cellular telephones, and stereo audio amplifiers. Their use has become pervasive, in part, because of their high efficiency and their ability to easily interface with digital audio circuits. A typical class-D output stage drives an output load by switching the load between different power supplies at a frequency greater than the bandwidth of the desired output signal. The switching energy is electrically and/or acoustically filtered by the characteristics of the particular load circuit. For example, if a class-D amplifier drives loudspeaker at a switching frequency higher than the audible frequency band, audio frequencies are converted to sound energy and the high frequency switching energy is filtered by the mass and/or inductance of the loudspeaker. Higher efficiencies are achieved when switching losses are minimized across the output switches of the class-D output stage. Because a class-D amplifier can receive and drive a pulse modulated signal, a class-D output stage can be interfaced directly to a digital output circuit without the need for precision analog components in the direct audio signal path.

Furthermore, a high dynamic range, which results in higher audio fidelity, can be achieved by using oversampled digital-to-analog conversion techniques, such as sigma-delta modulation, to provide a pulse modulated input signal to a class-D output stage. In most cases, however, a high-order sigma-delta modulator is limited to only a portion of the total possible output dynamic range because of instabilities that occur when the in-band output signal approaches 100% of the maximum modulation level. Many systems, therefore, limit the output of a sigma-delta DAC to about 50% of it maximum output using a maximum modulation range of 50%. For example, if a single ended operating class-D amplifier operates on a 10 volt power supply, the maximum in-band output signal is equivalent to only about 5V peak to peak when the maximum modulation range is set to 50%.

SUMMARY OF THE INVENTION

In an embodiment, an oversampled data converter includes a lowpass filter having a filter stage including a dynamic limiter, where the dynamic limiter having a limit set by an signal level at an input to the oversampled data converter. The oversampled data converter also includes a quantizing block having an input coupled to an output of the lowpass filter and an output coupled to an input of the lowpass filter.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an oversampled digital-to-analog converter for an audio application. The invention may also be applied, however, to other types of data converters, such as analog-to-digital converters, and to other types of applications.

In an embodiment, the limits of limiting stages within a filter of an oversampled modulator are dynamically adjusted according to an input level of the oversampled modulator. By dynamically adjusting the levels, modulation factors of 100% can be achieved.

Figure 1:
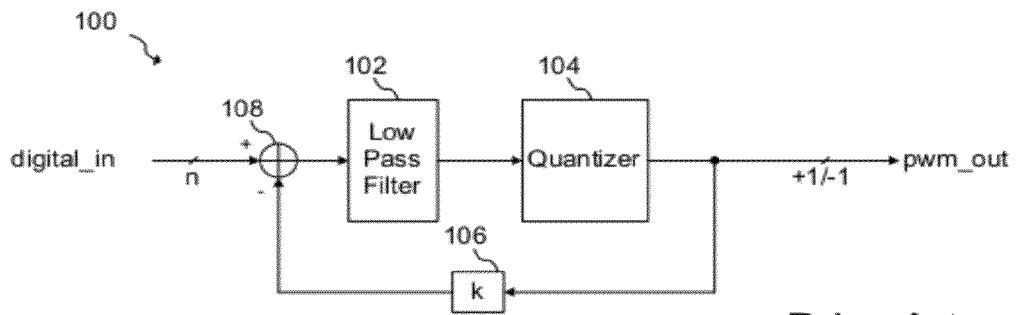
FIG. 1 illustrates a prior art modulator.

FIG. 1 illustrates conventional delta-sigma modulator 100 that converts digital data input stream digital_in to pulse modulated stream pwm_out. Output signal pwm_out is then used to drive a class-D output stage, or used to derive a pulse-width modulated signal used to drive a class-D output stage. Modulator 100 has low pass filter 102, quantizer 104, feedback block 106 and summing junction 108. Quantized signal pwm_out is subtracted from data input stream digital_in at summing junction 108 to form a closed loop. Low pass filter 102 ensures that the low frequency portion of the quantized output closely follows the digital_in. The feedback action of the loop shifts quantization noise generated by quantizer 104 into higher frequencies in the stop band of low pass filter 102. The higher the gain and the higher the order of lowpass filter 102, the lower the amount of quantization noise that falls within the passband of lowpass filter 102 with respect to the output spectrum of pwm_out.

When a high input level is presented to modulator 100, however, the loop can become unstable because of an effective decrease in the equivalent gain of quantizer 104. When a high order loop filter is used, this decrease in gain will shift some of the closed loop poles into the right hand portion of the complex plane. The practical effect of these instabilities is that the in-band noise floor increases at the onset of instability, thereby decreasing the signal to noise ratio (SNR). Accordingly, to avoid such instability, conventional applications generally limit the input signal level to the modulator to a fraction of its full dynamic range. In some applications, for example, the input signal level to the modulator is limited to 50% of its full-scale input range. As a consequence, the output range of the modulator is limited to fraction of its maximum output range. Such a scheme limits the ability of the modulator to produce an output modulation factor of 100%, which corresponds where the modulator uses the entire available dynamic range at the output. An example of a circuit operating at a 100% modulation factor is a single ended class-D amplifier that outputs a 1V peak-to-peak baseband signal while switching its output from 0V to 1V.

Figure 2:
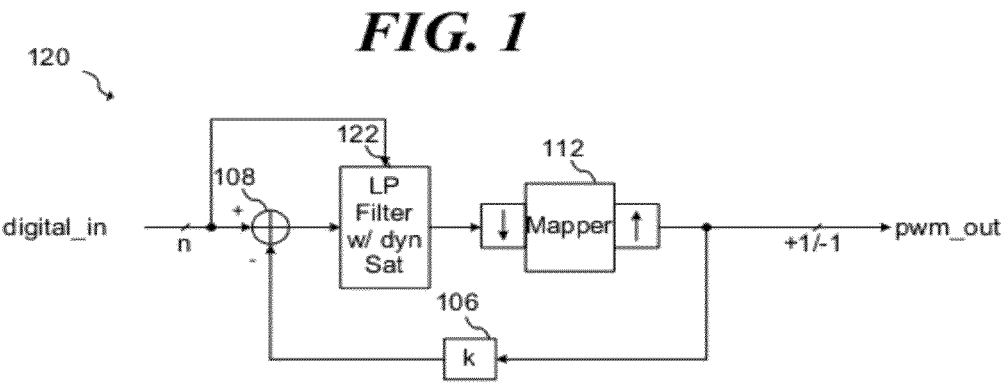
FIG. 2 illustrates a modulator according to an embodiment of the present invention.

FIG. 2 illustrates embodiment modulator 120, which achieves a 100% modulation factor and maintains stability by dynamically adjusting the limits of limiting stages within lowpass filter 122 according to an input level digital_in of oversampled modulator 120. Here, the quantization function of the loop is performed by pulse-width modulation mapper 112. In one embodiment, the output of lowpass filter 122 is converted to PWM symbols having a constant time period and varying pulse-widths.

Figure 3:
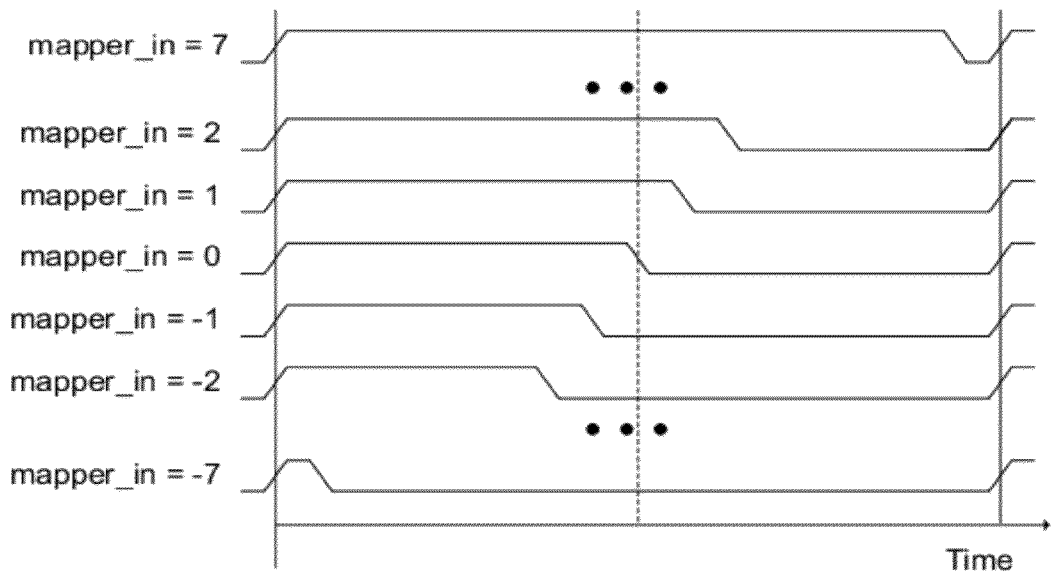
FIG. 3 illustrates a waveform diagram of an embodiment PWM mapping circuit.

FIG. 3 illustrates an embodiment PWM mapping function. At a mapping input of 7, the PWM mapping produces a long pulse-width at a mapping input of 7, whereas the mapping function produces a 50% duty cycle at a mapping input of 0. A short pulse-width is produced at a mapping input of −7. In the graph of FIG. 3, the y-axis represents a logic and/or voltage level and the x-axis represents time. PWM mappings corresponding to intermediate values 3 to 6 and −6 to −3 are not shown for simplicity of illustration. It should be appreciated that the mappings shown in FIG. 3 are just examples of many possible mappings. In embodiments that use a 100% modulation factor, the minimum input value corresponds to a 0% duty cycle pulse-width (e.g., the output remains low) and the maximum input value corresponds to a 100% duty cycle pulse-width. In embodiments that do not use a 100% duty cycle, the mapping function is scaled accordingly. In further embodiments, different mapping or quantization functions can be used.

Figure 4:
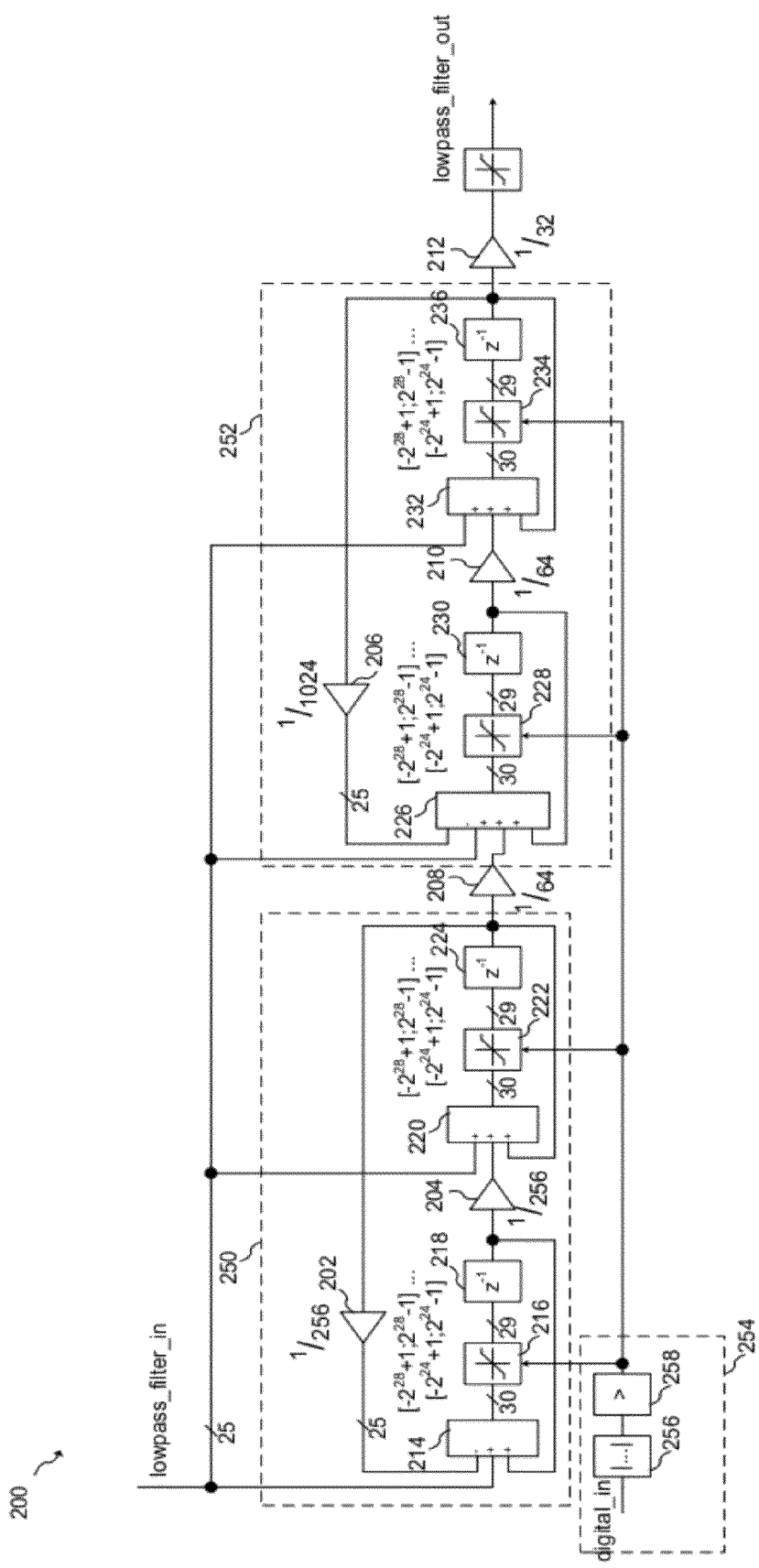
FIG. 4 illustrates an embodiment low pass filter with dynamically adjustable limiters.

FIG. 4 illustrates embodiment lowpass filter 200 with dynamic saturation elements. Data is provided the filter 200 from 25-bit bus lowpass_filter_in, and data is output from filter 200 at bus lowpass_filter_out. In an embodiment, lowpass filter 200 is a fourth order filter having two second order sections 250 and 252. Second order section 250 has a first integrator made of summing junction 214, programmable limiter block 216 and delay element 218, and a second integrator made of summing junction 220, programmable limiter block 222 and delay element 224. The output of delay element 224 is fed back to the input of the first integrator via gain block 202 summing junction 214. Second order section 252 has a first integrator made of summing junction 226, programmable limiter block 228 and delay element 230, and a second integrator made of summing junction 232, programmable limiter block 234 and delay element 236. The output of delay element 236 is fed back to the input of the first integrator via gain block 206 and summing junction 226. Second order section 252 is coupled to second order section 250 via gain block 208. In alternative embodiments, second order sections and the integrators with the second order sections can be implemented using various topologies known in the art. In further alternative embodiments, higher or lower filter orders can be implemented, and various further filter topologies can be used.

In an embodiment, the saturation limits of programmable limiters 216, 222, 228 and 234 are controlled by limiter control block 254. In an embodiment, limiter control block 252 takes absolute value 256 of modulator input digital_in and compares the absolute value from block 256 with a plurality of thresholds using comparator 258. The saturation limits of programmable limiters 216, 222, 228 and 234 are set depending on the output of comparators. In one embodiment, the saturation limits of these blocks can be set between from a digital output range of $[-2^{28}+1; 2^{28}-1]$ to a digital output range of $[-2^{24}+1; 2^{24}-1]$ according to the output of limiter control block 254. In one embodiment, the following saturation limits are determined as represented by the following pseudo-code:
  if |inp|<0x68000: sat $[-2^{28}+1;2^{28}-1]$ else
  if |inp|<0x70000; sat $[-2^{27}+1;2^{27}-1]$ else
  if |inp|<0x78000; sat $[-2^{26}+1;2^{26}-1]$ else
  if |inp|<0x7c000: sat $[-2^{25}+1;2^{25}-1]$ else
  sat $[-2^{24}+1;2^{24}-1]$.

Here, variable inp represents a 25 bit input work in two's complement form. Alternatively, other saturation limit ranges, numerical formats, mapping functions, and determination methods can be used. For example, the saturation limits can be determined using dedicated logic or a using processor.

In some embodiments, the elements of lowpass filter 200 are implemented using custom logic, standard logic, software, or other digital systems and methods. In one embodiment, the programmable saturation limits of programmable limiters 216, 222, 228 and 234 are implemented using lookup tables. Gain blocks 202, 204, 206, 208, 210 and 212 can be implemented, for example, using shifters. For example, scaling block 202 can perform its division function by right shifting its input by 8 bits. In alternative embodiments, some or all of the blocks of FIG. 4 can be constructed using analog blocks, and/or implemented using analog methods. In even further embodiments, embodiment modulator techniques can be used to implement an analog-to-digital converter.

Figure 5:
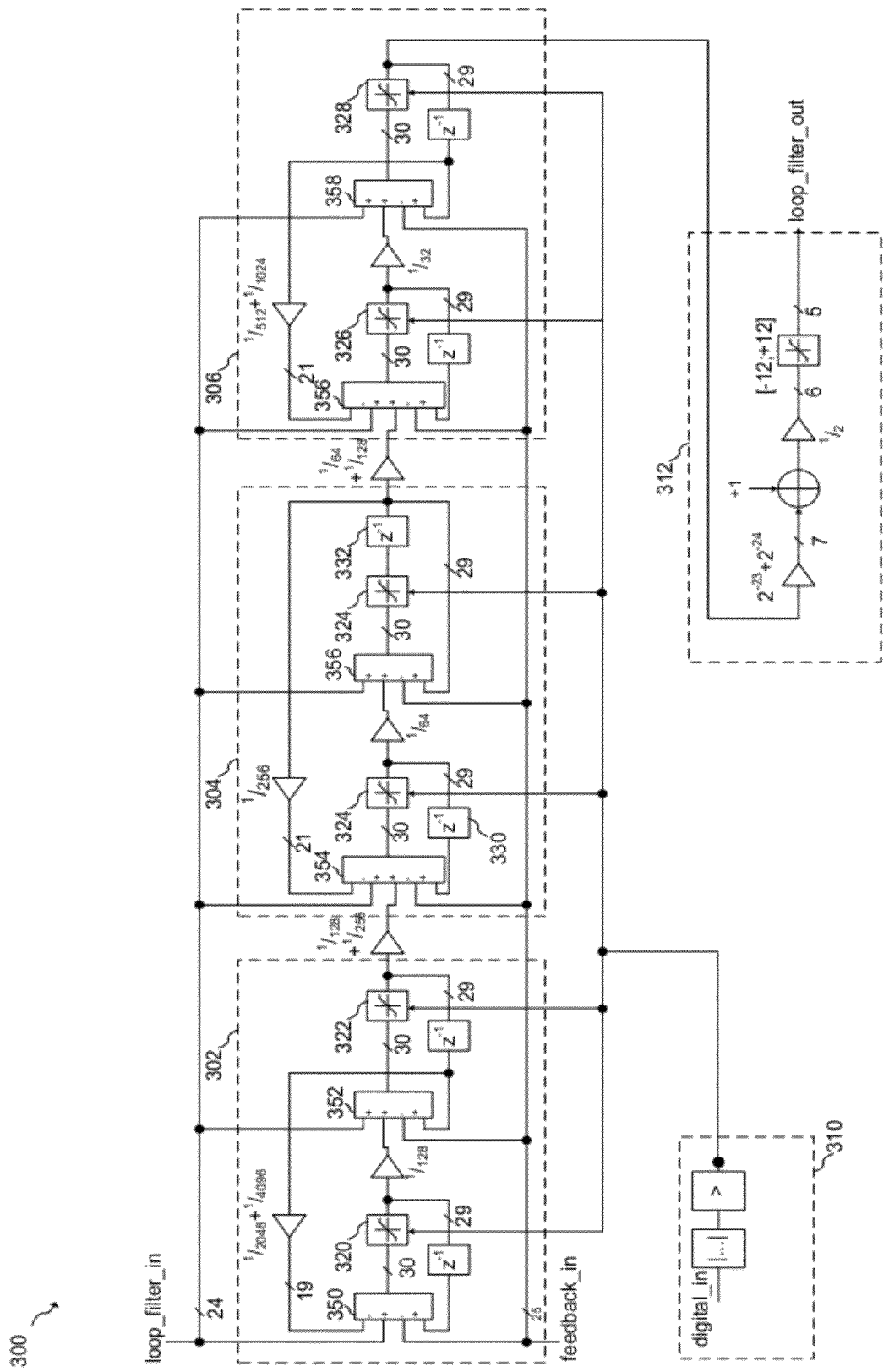
FIG. 5 illustrates a low pass filter with dynamically adjustable limiters according to an alternative embodiment.

FIG. 5 illustrates embodiment lowpass filter 300 that incorporates the function of summing junction 108 of FIG. 2 to close the modulator loop. This summing junction functionality is incorporated within summing blocks 350, 352, 354, 356 and 358. Lowpass filter 300 is a sixth order filter having second order sections 302, 304 and 306. The limits of programmable limiters 320, 322, 324, 326 and 328 are controlled by control block 310 and operates according to embodiments described hereinabove. In one embodiment, the saturation limits of these blocks can be set to provide a digital output range that varies from $[-2^{28}+1; 2^{28}-1]$ to $[-2^{24}+1; 2^{24}-1]$ depending on the output of limiter control block 310. Moreover, in alternative embodiments, a subset of the summing blocks can be used to sum the signals loop_filter_in, and feedback_in, or a separate summing block can also be used. It should be further understood that the blocks shown in FIG. 5 can partitioned separately as shown, or their functions can be incorporated into digital blocks that perform multiple functions, such as a processor circuit. In some embodiments, signal loop_filter_in is the input to the modulator, and signal feedback_in is the output of the quantizer, or a scaled version of the output of the quantizer. In some cases, this output is similar to the output of block 106 in FIG. 2.

In an embodiment, integrators within second order filter sections 302, 304 and 306 can be implemented in a variety of ways. For example, the first integrator in second order section 304 has delay block 330 in the feedback path of the integrator, while the second integrator in second order section 304 has delay block 332 in the forward path of the integrator. In further alternative embodiments, integrator delay blocks can be positioned within the filter in various further positions and configurations.

In an embodiment, output interface block 312 scales and quantizes the output of second order section 306 to a five bit word having two's complement values between −12 and 12 to form signal loop_filter_out, which is then provided to the input of a PWM mapping block, such as block 112 shown in FIG. 2. In further embodiments, other output word forms and quantization operations can be performed on the output of second order section 306.

Figure 6:
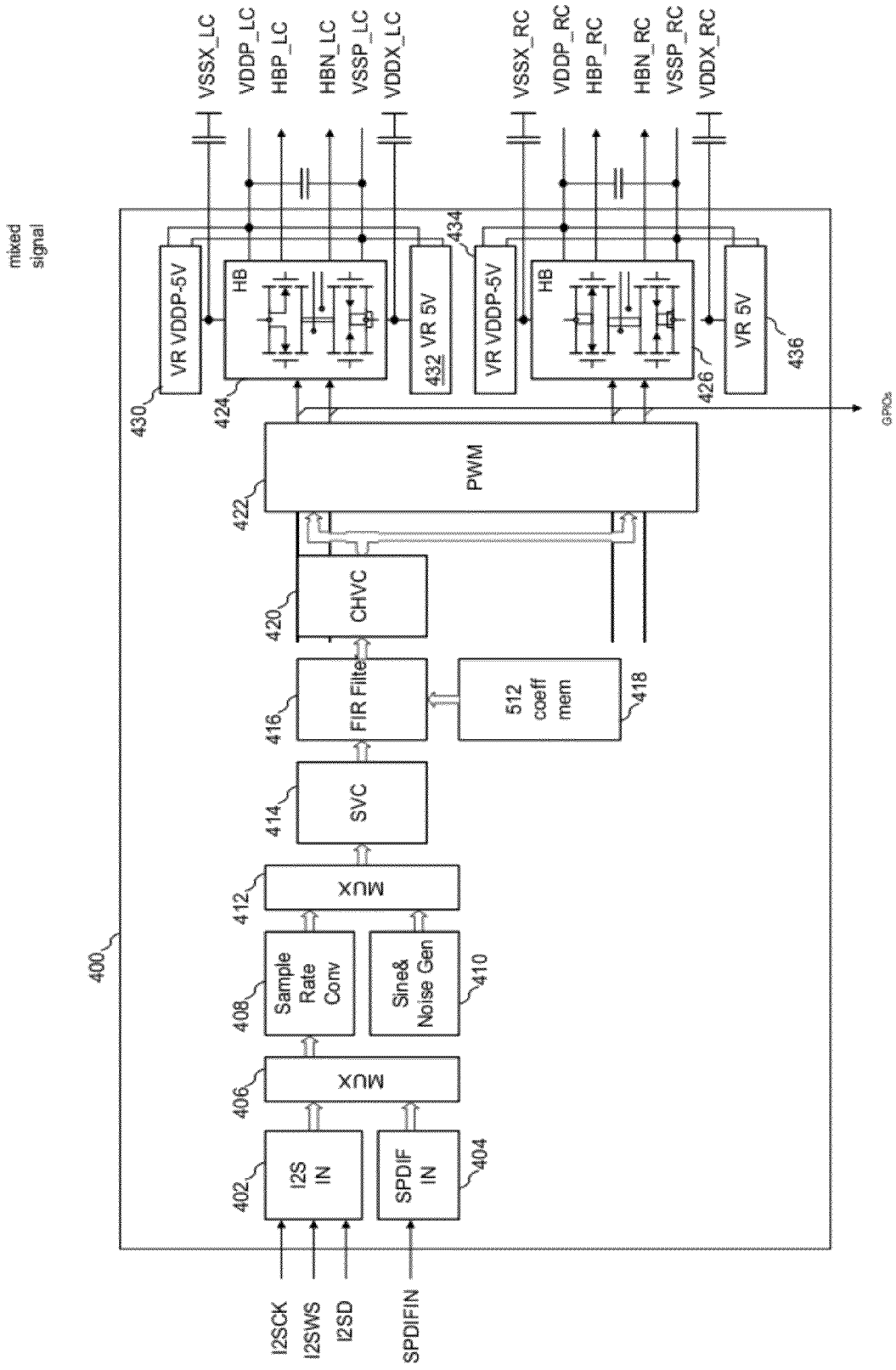
FIG. 6 illustrates an embodiment integrated circuit.

FIG. 6 illustrates integrated circuit 400 implementing an embodiment data converter. Here, audio data is received via Integrated Interchip Sound I2S interface 402 or via Sony/Philips Digital Interconnect Format (SPDIF) interface 404 and selected via MUX 406. Sample rate conversion block 408 converts the data sample rate, for example, from 32 KHz to 96 KHz, and mux 412 selects the re-sampled data or the output of test signal block 410 used in testing. Alternatively, other sample rates and conversion factors can be used. SVC block 414 controls volume, and bass and treble amplification or damping. FIR filter block 416 filters the output of SVC 414 based on coefficients in coefficient memory 418. The channel volume control block CHVC contains additional volume adjust elements and audio stream manipulation and limiting blocks. PWM block 422 converts the output of CHVC block to a pulse-width modulated waveform using the embodiment modulator functions as described hereinabove, the output of which is differentially output by class-D output diver 424. Voltage regulators 430, 432, 434 and 436 provide +/−5V voltage supply levels to class-D output drivers 424 and 426 for driving the gates of the output transistors. In alternative embodiments, other voltage supply levels can be used, or the voltage regulators can be omitted.

In an embodiment, second differential class-D driver 426 is included to provide a stereo output. In an embodiment, IC 400 can be used for such applications such as, but not limited to, an audio amplifier for television sets, radios, and home theatre amplifiers. It should be appreciated the IC 400 is just one example of many possible implementations of embodiment systems and methods.

In an embodiment, an oversampled data converter includes a lowpass filter having a filter stage comprising a dynamic limiter, wherein the dynamic limiter having a limit set by a signal level at an input to the oversampled data converter. The oversampled data converter also includes a quantizing block comprising an input coupled to an output of the lowpass filter and an output coupled to an input of the lowpass filter. In some embodiments, the filter stage includes a plurality of filter stages, where each of the plurality of filter stages has a respective dynamic limiter that has a limit set by the signal level at the input to the oversampled data converter. Moreover, in some embodiments, the oversampled data converter includes a summing junction coupled between the output of the quantizing block and the input to the lowpass filter, wherein the summing junction has a first input coupled to a system input, a second input coupled to the output of the quantizing block, and an output coupled to the input to the lowpass filter. In some embodiments, this summing junction is an explicit functional block that closes a modulator loop, while in other embodiments, this summing junction is implemented implicitly within the filter block.

In an embodiment, each of the plurality of filter stages further has a respective integrator. In some embodiments, each of the plurality of filter stages further has a respective delay element. In an embodiment, at least one of the filter stages includes a second-order filter stage that has two dynamic limiters and two integrators. In an embodiment, the step of filtering also includes forming further integrated signals, and limiting the further integrated signals based on the determined limit.

In an embodiment, the oversampled data converter also includes a limiter control block coupled to the input to the oversampled data converter. The limiter control block includes a comparator block comparing the signal level at the input to the oversampled data converter to a plurality of thresholds to form a first quantized control output. In some embodiments, the limit of the respective dynamic limiter is set by a level of the first quantized control output.

In one embodiment data converter is an oversampled digital-to-analog converter (DAC), however in alternative embodiments the data converters can be an analog-to-digital converter. In one embodiment, the quantizing block includes a pulse-width modulation mapping block that maps a value at an input of the quantizing block to a pulse-width modulated signal at the output of the quantizing block.

In an embodiment, a method of performing a data conversion includes determining a limit based on an amplitude of an input signal, and filtering a sum of the input signal and a feedback signal to form a filtered signal. In one embodiment, the filtering step includes integrating the sum of the input signal and feedback signal to form a first integrated signal, and limiting the integrated signal to the determined limit. The method also includes quantizing the filtered signal to form a quantized signal, forming the feedback signal based on the quantized signal, and forming an electronic output signal based on the quantized signal. In one embodiment, the quantized signal is configured to occupy 100% of a modulation rate value. In other embodiments, this modulation value can take on values different from 100%, for example 90%, 95% or other values. In some embodiments, quantizing the filtered signal comprises forming a pulse-width modulated (PWM) signal having a pulse-width proportional to an amplitude of the filtered signal. In one example, the pulse-width modulated (PWM) signal includes mapping an output value to a one of a plurality of pulse-widths within a fixed pulse period. In an embodiment, the method also includes driving a loudspeaker with the electronic output signal.

In an embodiment, an integrated circuit includes an oversampled digital-to-analog converter (DAC) that has a lowpass filter and a quantizing block. The lowpass filter has filter stages that include an integrator and a dynamic limiter, where the dynamic limiter has a limit set according to a signal level at an input to the oversampled DAC. The quantizing block includes an input coupled to an output of the lowpass filter and an output coupled to an input of the lowpass filter. In an embodiment, the quantizing block includes a pulse-width modulation (PWM) generator that converts the output of the lowpass filter to a pulse-width modulated signal. In an embodiment, the pulse-width modulated signal has a fixed pulse period and a varying duty cycle. In some embodiment, a signal output of the quantizing block is configured to occupy 100% of a modulation rate value, and in some embodiment, the integrated circuit also includes a class-D audio driver coupled to an output of the quantizing block.

In some embodiment, the integrated circuit further includes a limit generation block coupled to the input to the oversampled DAC. The limit generation block has a comparator comparing the signal level at the input to the oversampled DAC to a plurality of thresholds to form a first quantized control signal. The limit of the dynamic limiter of the filter stages is set according to the first quantized control signal.

Advantages of embodiments include the ability to operate an oversampled DAC at up to 100% modulation factor without suffering instabilities and the unacceptable decreased SNR that accompanies such instabilities. A further advantage of embodiments includes the ability to maintain the performance of an oversampled DAC without limiting the output amplitude of the DAC, or without using a lower loop filter gain.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An oversampled data converter comprising:
   a lowpass filter having a filter stage comprising a dynamic limiter, the dynamic limiter having a variable limit set by a signal level at an input to the oversampled data converter; and
   a quantizing block comprising an input coupled to an output of the lowpass filter and an output coupled to an input of the lowpass filter.

2. The oversampled data converter of claim 1, wherein the oversampled data converter is an oversampled digital-to-analog converter (DAC).

3. The oversampled data converter of claim 2, wherein the quantizing block comprises a pulse-width modulation mapping block, the pulse-width modulation mapping block mapping a value at an input of the quantizing block to a pulse-width modulated signal at the output of the quantizing block.

4. The oversampled data converter of claim 2, wherein the filter stage comprises a plurality of filter stages, each of the plurality of filter stages comprising a respective dynamic limiter having a limit set by the signal level at the input to the oversampled data converter.

5. The oversampled data converter of claim 4, wherein each of the plurality of filter stages further comprises a respective integrator.

6. The oversampled data converter of claim 4, wherein each of the plurality of filter stages further comprises a respective delay element.

7. The oversampled data converter of claim 4, wherein at least one of the filter stages comprises a second-order filter stage, the second order filter stage comprising two dynamic limiters and two integrators.

8. The oversampled data converter of claim 4, further comprising a limiter control block coupled to the input to the oversampled data converter, the limiter control block comprising a comparator block comparing the signal level at the input to the oversampled data converter to a plurality of thresholds to form a first quantized control output, wherein the limit of the respective dynamic limiter is set by a level of the first quantized control output.

9. The oversampled data converter of claim 1, further comprising a summing junction coupled between the output of the quantizing block and the input to the lowpass filter.

10. The oversampled data converter of claim 1, wherein the lowpass filter further comprises at least one summing block that sums the output of the quantizing block with the input to the oversampled data converter.

11. A method of performing a data conversion, the method comprising:
    determining a limit based on an amplitude of an input signal; and
    filtering a sum of the input signal and a feedback signal to form a filtered signal, filtering comprising
        integrating the sum of the input signal and feedback signal to form a first integrated signal, and
        limiting the integrated signal to the determined limit;
    quantizing the filtered signal to form a quantized signal;
    forming the feedback signal based on the quantized signal; and
    forming an electronic output signal based on the quantized signal.

12. The method of claim 11, wherein the quantized signal is configured to occupy 100% of a modulation rate value.

13. The method of claim 11, wherein quantizing the filtered signal comprises forming a pulse-width modulated (PWM) signal having a pulse-width proportional to an amplitude of the filtered signal.

14. The method of claim 13, wherein forming the pulse-width modulated (PWM) signal comprises mapping an output value to a one of a plurality of pulse-widths within a fixed pulse period.

15. The method of claim 11, further comprising driving a loudspeaker with the electronic output signal.

16. The method of claim 11, wherein filtering further comprising:
    forming further integrated signals; and
    limiting the further integrated signals based on the determined limit.

17. An integrated circuit comprising:
    an oversampled digital-to-analog converter (DAC), the oversampled DAC comprising:
        a lowpass filter having filter stages comprising an integrator and a dynamic limiter, the dynamic limiter having a variable limit set according to a signal level at an input to the oversampled DAC; and
        a quantizing block comprising an input coupled to an output of the lowpass filter and an output coupled to an input of the lowpass filter.

18. The integrated circuit of claim 17, wherein the quantizing block comprises a pulse-width modulation (PWM) generator, the PWM generator converting the output of the lowpass filter to a pulse-width modulated signal.

19. The integrated circuit of claim 18, wherein the pulse-width modulated signal comprises a fixed pulse period and a varying duty cycle.

20. The integrated circuit of claim 17, wherein a signal output of the quantizing block is configured to occupy at least 95% of a modulation rate value.

21. The integrated circuit of claim 17, further comprising a class-D audio driver coupled to an output of the quantizing block.

22. The integrated circuit of claim 17, further comprising a limit generation block coupled to the input to the oversampled DAC, the limit generation block comprising a comparator comparing the signal level at the input to the oversampled DAC to a plurality of thresholds to form a first quantized control signal, wherein the limit of the dynamic limiter of the filter stages is set according to the first quantized control signal.

23. The integrated circuit of claim 17, further comprising a summing junction coupled between the output of the quantizing block and the input of the lowpass filter.

24. The integrated circuit of claim 17, wherein the lowpass filter comprises a summing block that sums the output of the quantizing block with the input to the oversampled DAC.

* * * * *